US008778234B2

(12) United States Patent
King et al.

(10) Patent No.: US 8,778,234 B2
(45) Date of Patent: Jul. 15, 2014

(54) PROCESS FOR THE MANUFACTURE OF A HIGH DENSITY ITO SPUTTERING TARGET

(75) Inventors: Charles Edmund King, Oxford (GB); Dosten Baluch, Pinner (GB)

(73) Assignee: Bizesp Limited, Oxford (GB)

( * ) Notice: Subject to any disclaimer, the term of this patent is extended or adjusted under 35 U.S.C. 154(b) by 438 days.

(21) Appl. No.: 12/992,067

(22) PCT Filed: May 7, 2009

(86) PCT No.: PCT/GB2009/050475
§ 371 (c)(1),
(2), (4) Date: Feb. 1, 2011

(87) PCT Pub. No.: WO2009/138774
PCT Pub. Date: Nov. 19, 2009

(65) Prior Publication Data
US 2011/0127162 A1 Jun. 2, 2011

(30) Foreign Application Priority Data
May 12, 2008 (GB) .................................. 0808431.1

(51) Int. Cl.
*H01B 1/02* (2006.01)
(52) U.S. Cl.
USPC ...................... 252/520.1; 204/298.13; 264/28; 264/129; 264/299; 423/594.9; 438/104
(58) Field of Classification Search
USPC .................. 252/520.1; 438/104; 204/298.13; 264/28, 129, 299; 423/594.9
See application file for complete search history.

(56) References Cited

U.S. PATENT DOCUMENTS

| 4,238,342 A | | 12/1980 | Im et al. |
| 5,433,901 A | * | 7/1995 | Rancoule et al. ................ 264/28 |
| 6,533,966 B1 | * | 3/2003 | Nonninger et al. ......... 252/520.1 |
| 2007/0080428 A1 | | 4/2007 | Herman et al. |
| 2009/0298225 A1 | * | 12/2009 | Wu et al. ........................ 438/104 |

FOREIGN PATENT DOCUMENTS

| JP | 60186416 | | 10/1985 | |
| JP | 1290550 | | 11/1989 | |
| JP | 1290551 | | 11/1989 | |
| JP | 1290764 | | 11/1989 | |
| JP | 03-071510 | * | 3/1991 | ............... H01B 5/14 |
| JP | 3071510 | | 3/1991 | |
| JP | 5201731 | | 8/1993 | |
| JP | 7243036 | | 9/1995 | |
| JP | 8310865 | | 11/1996 | |
| JP | 10330926 | | 12/1998 | |

(Continued)

OTHER PUBLICATIONS

Zhang, "Manufacture of ITO Target with High Density and High Conductivity" Rare Metal Material and Engineering, vol. 35, No. 7 p. 1021-1024.

*Primary Examiner* — Khanh Tuan Nguyen
(74) *Attorney, Agent, or Firm* — Hamilton DeSanctis & Cha

(57) ABSTRACT

A process for manufacturing indium tin oxide (ITO) sputtering targets as described. The process includes the precipitation of indium and tin hydroxides, sintering in the absence of chloride ions, using the resultant oxide powders to prepare an aqueous slip with dispersing agent, binder, special high density promoting agents and compacting the slip in a specially surface coated porous mold using the method of slip casting followed by sintering the resultant compacted target body to yield high density ITO target.

7 Claims, 3 Drawing Sheets

(56) References Cited

FOREIGN PATENT DOCUMENTS

| | | |
|---|---|---|
| JP | 2004123523 | 4/2004 |
| JP | 2005324987 | 11/2005 |
| JP | 2006103983 | 4/2006 |
| JP | 2006206349 | 8/2006 |
| JP | 2007254235 | 10/2007 |
| JP | 2008084788 | 4/2008 |
| TW | 588114 | 5/2004 |
| WO | WO 2006/054953 * 5/2006 | ............. C23C 16/40 |

* cited by examiner

PROCESS FOR THE MANUFACTURE OF A HIGH DENSITY ITO SPUTTERING TARGET

CROSS REFERENCE TO RELATED APPLICATION

The present application claims priority to (is a national stage filing of) PCT Application PCT/GB2009/050475 filed May 7, 2009, which claims priority to British Patent Application No. GB0808431.1 filed May 12, 2008. The entirety of each of the aforementioned references is incorporated herein by reference for all purposes.

BACKGROUND OF THE INVENTION

This invention relates to a method of manufacturing indium tin oxide (ITO) sputtering targets. In particular, the invention relates to the precipitation and calcining of indium and tin hydroxides, preparation of an aqueous slip from the resultant oxide powders, and compacting the slip in a porous mold using the method of slip casting followed by sintering the resultant compacted target body to yield a high density ITO target.

Transparent conducting thin films of ITO are required for the manufacture of devices such as flat panel display screens and solar cell panels where the ITO film is used to form transparent conducting electrodes. With expansion of the market for flat panel display screens and proliferation of equipment such as Liquid Crystal Display (LCD) screens for televisions, lap top computers and cell phones as well as expansion of the solar cell market, demand for ITO thin films has rocketed. The reason ITO is so commonly used rather than other materials is because of the high light transmission and electrical conductivity of its thin films, and the stability over long service life of equipment, such as LCD televisions, where it is used. The electrically conducting transparent thin films of ITO are known to be produced by a process called sputtering. This is a vacuum deposition method that requires an ITO sputtering target. The latter is a shaped body such as a rectangular tile of high density ITO material.

The quality of the ITO target is very important to obtaining satisfactory sputtering, and for the manufacture of an ITO thin film of quality sufficient for use in LCD related applications, especially LCD's based on Thin Film Transistors (TFT). One key parameter is uniform and high target density across the target body. If the target density is not high and not uniform, then problems are encountered during the ITO sputtering process. The sputtering is carried out using a high vacuum plasma process enhanced by a magnetic field. Normally, a conventional ITO target having a flat rectangular plate shape is used. During sputtering, the material from the target surface is eroded in a shape that mirrors the shape of the local magnetic field. The shape often formed is a curved oval shaped pit called the 'race track'. This means that the target's utility efficiency is not 100%, and can be as low as 30%. Although the utility efficiency can be improved by recycling the used ITO target, the process becomes unviable if the utility efficiency is further adversely affected by low or non-uniform target density which can cause problems such as 'nodules' or target cracking during use. Both of these problems have an adverse effect on ITO thin film quality.

In the prior art, ITO targets were prepared by molding a mixture of indium oxide and tin oxide powders by pressure molding processes such as a hot press molding process to obtain a molded shaped ITO body. However, there are severe limitations to these types of pressure molding processes. One limitation is that modern LCD production lines, called Generation 7, 8 or 10 lines, require large sheets of ITO coated glass. This in turn means that ITO sputtering lines need large size ITO targets. However, when a large ITO target is prepared by a process such as hot pressing, it is difficult to obtain uniform pressure across the target surface, leading to the problems of target warp or cracking. Additionally, such a target suffers from non-uniformity of density as well as non-uniformity of chemical and physical properties across the target body resulting in non-homogenous sputtering across the target surface during the plasma sputtering process. This in turn leads to the formation of nodules on the target surface which reduces the target utilization rate to much less than 30%, since nodules adversely affect ITO thin film quality.

To overcome these issues, prior art discloses the preparation and use of small tiles to prepare large areas by tiling the small tiles together in a 2-dimensional array. In this way, a plurality of small tiles are assembled in an array to give a large surface area target. However, such tiled targets suffer from the problem of catastrophic electric discharges and heat stress chipping at the joints between the small tiles, which not only reduces target utilization rate but also increases the incidence of nodules, and this combination adversely affects the properties of the ITO thin film.

In another method to overcome the above problems, ITO targets are manufactured by using a method known as slip casting which can be carried out under pressure or without pressure.

In one slip casting method (as described, for example, in JP 1117136/88, JP 117137/88, and JP 117138/88), the indium oxide and tin oxide powders are mixed in a liquid such as water with a dispersing agent and a binder to give a slurry called 'slip' which is injected into a water absorbing porous mold made of gypsum. The slurry in the mold then slowly dries as the water leaves the mold via the mold pores. This method is called slip casting. The dispersing agent used is, for example, selected from polycarboxylic acids and the binder is selected, for example, from acrylic or polycarbonate emulsions. This process enables ITO targets of a desired shape and size to be obtained simply by changing the shape and size of the mold. In this method, the slurry is injected into a mold under pressure in the range 50 to 200 kPa. Further increases in target density are obtained by subjecting the post dried target to compression by pressure using a cold isostatic press which applies a pressure not less than 100 MPa. The ITO target is then sintered at 1300 to 1400° C. to obtain a dense target with densities greater than 95%. However, this approach suffers from the problem that the yield of targets with densities greater than 99% is low. Further, targets prepared in this way often crack during cold pressing, as well as suffering from nodule formation during sputtering, thereby reducing target utilization below the economically viable threshold. Furthermore, during filling of the mold, the mold material is dispersed into the slurry and adheres to the ITO "green" tile, resulting in contamination of the target by the mold material. These impurities then lead to reduction in the ITO thin film conductivity and problems in the sputtering process such as, for example, the formation of nodules.

In another method (described in JP 2005324987), to prevent such cracking during manufacture, indium and tin oxide powders, water and an organic binder are mixed and then spray dried to yield a granulated powder which is then milled, high pressure press molded and then sintered to yield the ITO target. However, this is a non-slip casting method and suffers from the same problems as described above for non-slip casting methods, such as limitation to small size targets, non uniform densities and abnormal electric discharges during sputtering.

In another embodiment of the prior art (TW 588114B), to overcome the problem of cracking, the ITO target is produced by sintering indium and tin oxides powder mixture, dissolving in aqua regia and filtering with a 0.2 micron filter. After co-precipitation, the oxides are pressed and fired to yield a target which has high density and does not suffer from the problem of nodules. However, this is a long and expensive method. It is also a non-slip casting method so suffers from the problem of size limitation as discussed above.

In another embodiment of the prior art (JP 10330926), to obtain a target that increases utilization during sputtering by minimizing nodules and abnormal electric discharges, the density of the target is regulated to achieve ≥99% and also the maximum diameter of voids existing in the sintered target are regulated to less than or equal to 10 microns with less than 1000 voids in one mm2 area of the target. This is achieved by co-precipitation of indium and tin hydroxides and then calcining in an atmosphere containing hydrogen halide gas such as hydrogen chloride or halogen gas such as chlorine to obtain the corresponding oxides. The oxide powders are then molded into a compact body by slip casting and firing the slip cast green target. In this way, targets of size greater than 100 cm2 can be obtained with densities 2 99%. However, this method is enormously hazardous due to the use of highly poisonous and unstable gases.

In another embodiment of the prior art (JP7243036), to obtain a target that increases utilization during sputtering by minimizing nodules and abnormal electric discharges, an ITO sintered target is produced from a raw material consisting essentially of indium oxide and tin oxide prepared by powder metallurgical engineering. In this case, the average crystal grain diameter is controlled to c4 micron, the number of voids having 3-8 micron average diameter is controlled to <900 void/mm$^2$, the surface roughness Ra is adjusted to <0.5 micron. However, statistically it is very difficult to control all these features simultaneously and ensure consistently good target manufacturing yields.

Hence, there exists a need in the art for systems and methods to obviate or mitigate at least some of the limitations set out above.

BRIEF SUMMARY OF THE INVENTION

This invention relates to a method of manufacturing indium tin oxide (ITO) sputtering targets. In particular, the invention relates to the precipitation and calcining of indium and tin hydroxides, preparation of an aqueous slip from the resultant oxide powders, and compacting the slip in a porous mold using the method of slip casting followed by sintering the resultant compacted target body to yield a high density ITO target.

The object of the present invention is to provide a process for mass manufacturing ITO sputtering targets of a large size (preferably 2 250 cm2) and high relative density (preferably 2 99%) for high utilization efficiency in LCD related sputtering applications.

This objective is obtained by a method that involves (at least in preferred embodiments) the co-precipitation of indium and tin hydroxides from chloride solutions, filtering, washing and calcining the hydroxides in the presence of small amounts of chloride ions ≤100 ppm, preparation of an aqueous slurry of the oxides with additives such as dispersing agent, binder, special high density promoters based on phosphorous compounds, milling the slurry to obtain a 'slip' of the right particle size distribution and particle surface area, compacting the slurry using slip casting in a specially sugar and chelating agent coated porous mold and then sintering the resultant compacted 'green' target body in an oxygen atmosphere to yield a dark grey high density ITO target.

In accordance with one aspect of the present invention there is provided a method of producing granulated ITO powder for use in the manufacture of ITO sputtering targets. An intimate mixture of indium and tin hydroxides and chloride ions is calcined in air to produce the granulated ITO powder. The chloride ions are present as $InCl_3$ and $SnCl_4$ and/or ammonium chloride, and the concentration of $InCl_3$ and $SnCl_4$ in the mixture is between approximately 1 ppm and 100 ppm. The hydroxide mixture may be calcined at a temperature in the range approximately 800° C.-1200° C., preferably approximately 900° C.

The mixture may be obtained by co-precipitating indium and tin hydroxides in chloride media followed by filtering and washing. The washing may be carried out such that not all chloride ions are removed from the precipitate. It is this that enables the intimate mixture of the chlorides and hydroxides during the calcining operation. In accordance with another aspect of the present invention there is provided a method of forming an ITO slip for use in the manufacture of ITO sputtering targets. A slip comprising granulated ITO powder, water and additives is formed. A phosphorus compound (such as, for example, phosphoric acid, a phosphorous oxide, indium phosphate or tin phosphate) is also included in the slip in a concentration between 0.001% and 1% by weight. The phosphorus compound converts to phosphorous compounds with other additives present in the slip such as silicates: such compounds are glassy and form a liquid phase during sintering. In this way, they act as sintering and high density promoters in the sintering process, leading to higher densities of greater than 99% in the ITO target.

The granulated ITO powder obtained from the calcining process preferably comprises indium(III) and tin(IV) oxides of surface area 2.5-5.5 m$^2$/g, more preferably 4.5-5.0 m$^2$/g, in concentrations of not less than 75%, more preferably 75-85%, by weight. This granulated powder is incorporated into water base slurry which is converted into a slip for slip casting via the process of milling. The milling increases the surface area of the ITO powder to 6-9 m$^2$/g. The slip may also contain one or more binders such as acrylic or polycarbonate emulsions and/or a dispersing agent such as a polycarboxylic acid.

The slip may then be slip cast by injection into a porous mold and left at ambient temperatures to form a "green body". The green body may then be dried and then fired at high temperatures in high purity oxygen to achieve sintering. It is at this stage that the presence of glassy liquid phosphorus phases assist the gain of high density in the target.

In accordance with a further aspect of the present invention there is provided a method of manufacturing an ITO sputtering target. A porous mold of gypsum or plaster of Paris is coated with a layer of a sugar and/or a chelating agent as a release agent. An ITO slip is then injected into the mold at pressures of 0.1 to 45 psi.

The release agent may include a sugar compound such as sucrose or glucose, and/or EGTA, BAPTA or EDTA. In one embodiment the mold is sprayed with a 1% by weight sugar solution with EGTA, BAPTA or EDTA.

A green body may then be produced by leaving the slip in the mold for a period of time. The green body may then be dried and then fired at a temperature between approximately 1000° C. and 1750° C. under high purity oxygen.

The invention also provides an ITO sputtering target made using the methods described above. In another aspect of the present invention there is provided an ITO target comprising indium (III) oxide and tin (IV) oxide, the indium (III) oxide content not less than 75% by weight, the target further comprising a third component including at least one phosphorus compound. The proportion of phosphorus compound present in the sintered ITO target may be in the range 1-200 ppm.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

This invention relates to a method of manufacturing indium tin oxide (ITO) sputtering targets. In particular, the invention relates to the precipitation and calcining of indium and tin hydroxides, preparation of an aqueous slip from the resultant oxide powders, and compacting the slip in a porous mold using the method of slip casting followed by sintering the resultant compacted target body to yield a high density ITO target.

Figure 1:
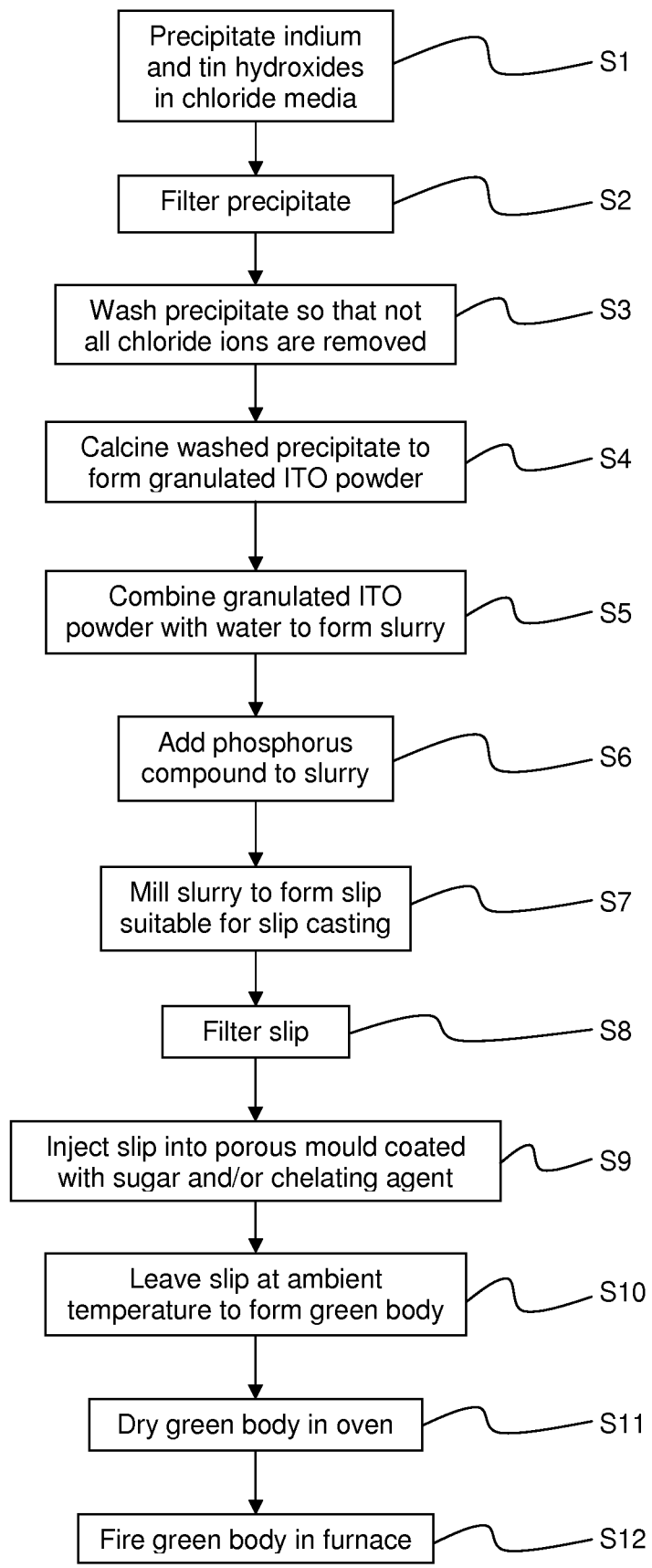
FIG. 1 is a flow chart illustrating the stages involved in manufacturing an ITO sputtering target.
Figure 2:
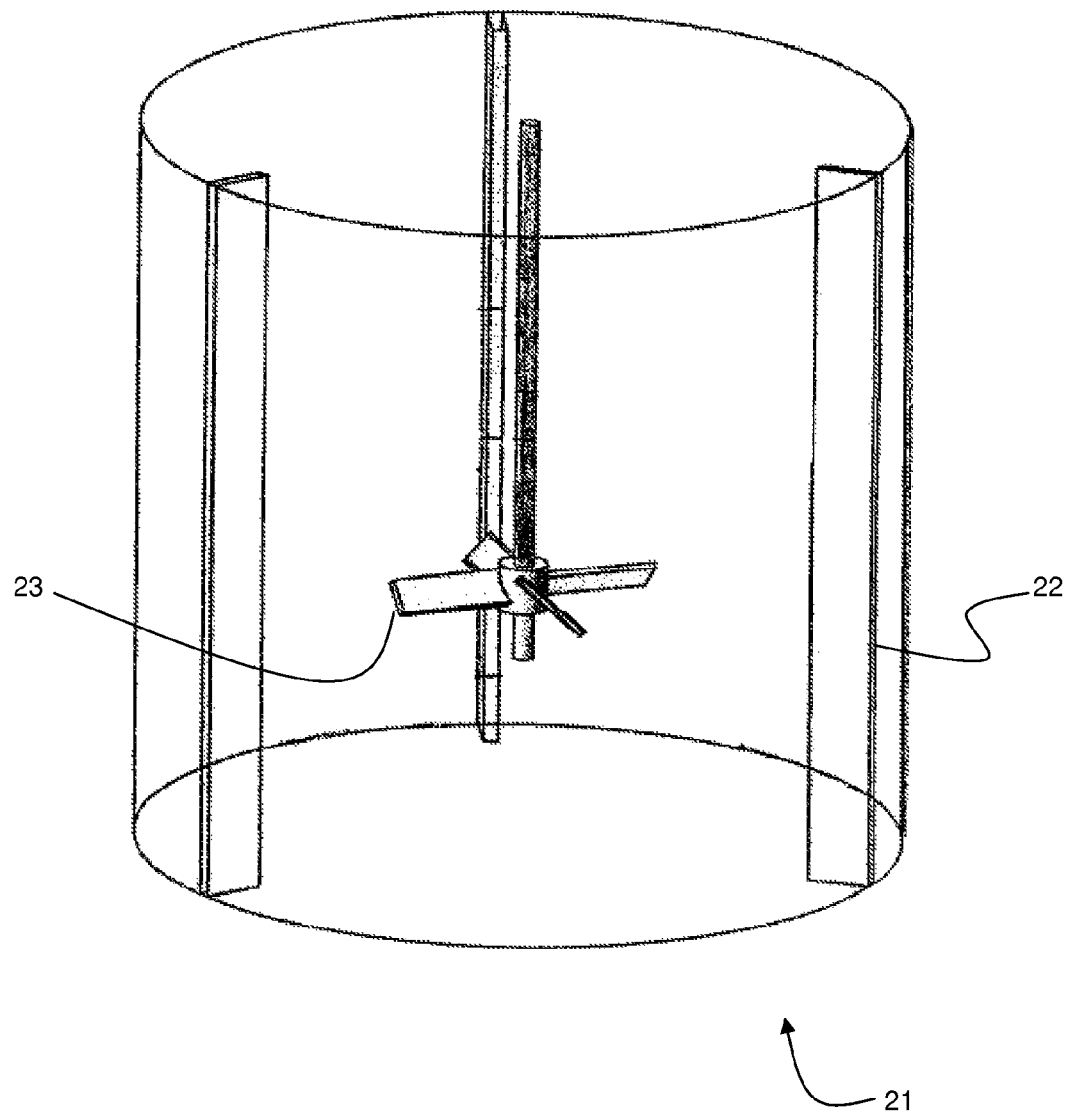
FIG. 2 is an illustration of a mixing vessel for mixing a slip.

In order that the present invention may be fully understood and readily put into practical effect, there shall now be described by way of non-limitative example only preferred embodiments of the present invention with reference to the accompanying drawings, in which:

FIG. 1 is a flow chart illustrating the stages involved in manufacturing an ITO sputtering target;

FIG. 2 is an illustration of a mixing vessel for mixing a slip; and

Figure 3:
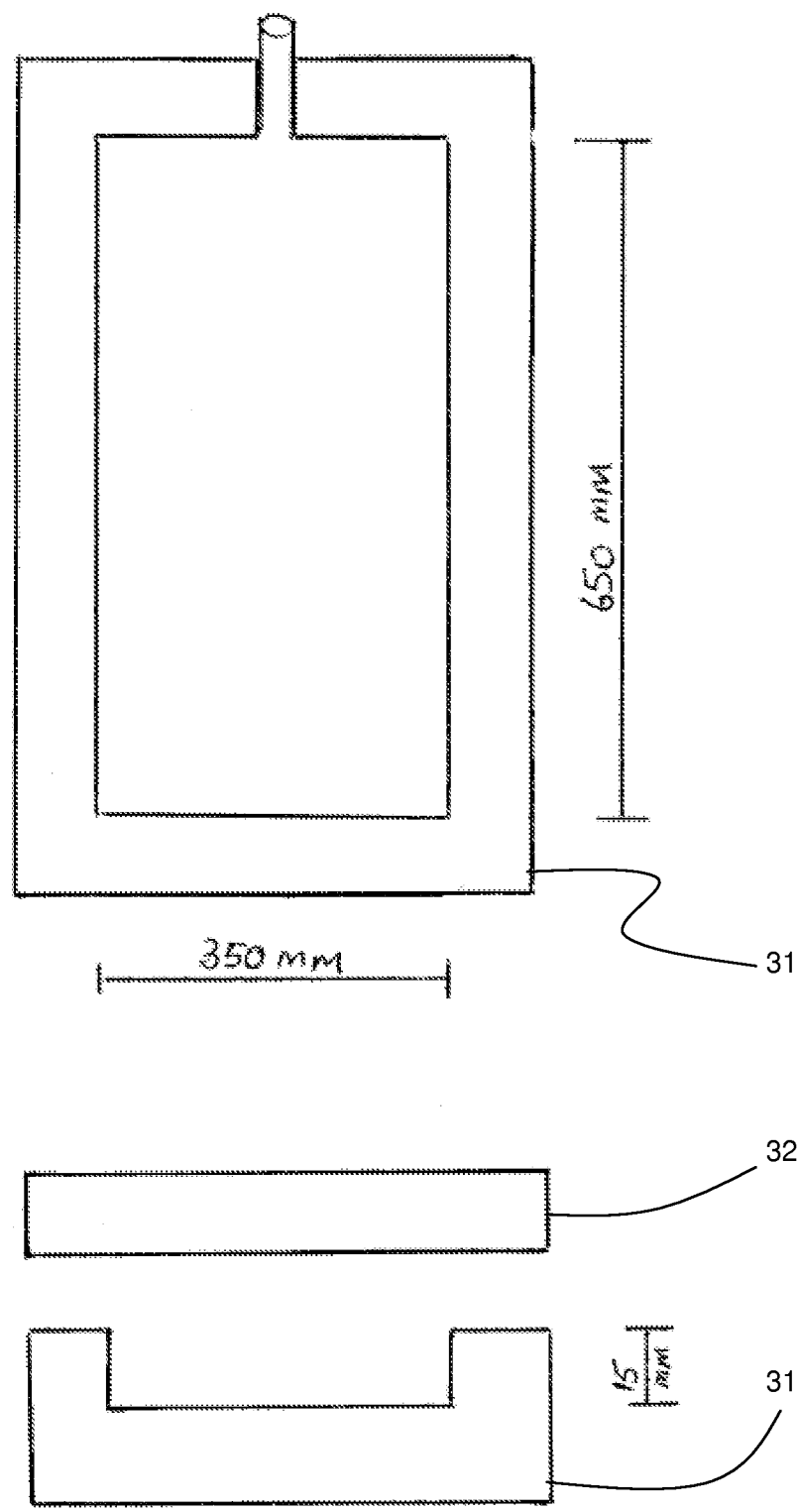
FIG. 3 is a schematic illustration of a plaster of Paris mold.

FIG. 3 is a schematic illustration of a plaster of Paris mould.

After intensive investigations of the prior art and problems of nodule formation, non-uniform target densities, abnormal electric discharges and the adverse affects of these problems on target utilization rates, the present inventors have succeeded in improving the rate of large size target 1 250 cm2 utilization in TFT-LCD related sputtering processes by a method that does not involve the use of hazardous gases of the prior art such hydrogen chloride or chlorine nor requires cold isostatic pressing to achieve high and uniform densities.

The improved process enables production of ITO sputtering targets of large size $\geq 250$ cm$^2$ that give ITO thin films of quality suitable for TFT-LCD industry and offer high target utilization rates by overcoming problems such as nodule formation, target cracking, non-uniform properties across target body and abnormal electric discharges during sputtering.

ITO targets are produced that contain indium(III) oxide and tin(IV) oxide where the indium(III) oxide content is not less than 75% by weight. Also, the presence of a third component other than the oxides of indium and tin is permitted for attaining high and uniform target densities whilst minimizing target cracking. Such a third component preferably comprises phosphorus compounds.

The Process is Described with Reference to FIG. 1.

In a first stage of the process, indium and tin hydroxides are precipitated in chloride media (S1), filtered (S2), washed (S3) and calcined at 800-1200° C. (S4). The washing is carried out such that not all chloride ions are removed from the precipitate with the result that during the calcining operation, chlorides present are intimately mixed with the oxides. It is thought that the chloride ions are attached to the hydroxide particles by weak Van der Waals forces of molecular attraction. The chloride ions decompose at the high calcining temperatures releasing chlorine gas at microscopic levels intimately close to the oxide particles. It is thought that the oxidizing nature of chlorine assists in keeping the metals in their highest stable oxidation states whilst also assisting in calcining by introducing a gaseous state around the oxide particles. It will be clear to those skilled in the art that this is a more efficient and safer way of introducing chlorine at microscopic levels into the oxide powder matrix by decomposition of chloride ions mixed intimately with oxide particles than the hazardous method of JP10330926 mentioned above where chlorine gas is pumped into the oxide sintering ovens.

The granulated indium and tin oxide powder resulting from the calcining process has surface area in the range 2.5 to 5.5 m$^2$/g, preferably 4.5 to 5.0 m$^2$/g. The powder is made into a slurry with water (S5) and mixed in a mixing vessel 21 shown in FIG. 2. The mixing vessel 21 includes baffles 22 and an impeller 23. The proportions of the constituents of the slurry are chosen such that the concentration of the oxides is not less than 75% by weight and more preferably in the range 75-85%. If the concentration is lower, then the resultant target is likely to crack during manufacturing and also to suffer from non-uniform and low densities. The slurry also contains dispersion agents, such as polycarboxylic acids, in concentrations of 0.1 to 0.7% by dry basis mass of the ITO powder, and binders, for example acrylic or polycarbonate emulsions, in concentrations of 0.1 to 2% by dry basis mass of the ITO powder, though not specifically limited to these compounds. The slurry additionally contains phosphorous added as a phosphorus compound (S6) for example phosphoric acid, phosphorus oxide or phosphate salts of indium or tin in concentrations of 0.001% to 1% by weight.

The slurry is converted into a slip suitable for slip casting by milling (S7) using either a bead mill, attrition mill or a ball mill. The milling is conducted until the ITO particles have reached a particle size distribution of such that the particles sizes are in the range 50-800 nm and the surface area is 8.1 m$^2$/g. The viscosity of such slip is in the range 400 to 1000 cps as measured by a Brookfield rheometer using spindle 65 at a spindle speed of 25 rpm.

The slip so obtained is then filtered (S8) through a 0.5 micron filter and then injected (S9) into a porous mould made of materials such as gypsum, Plaster of Paris or porous polymers. A suitable mould 31 with a cover 32 is shown in plan view and end view in FIG. 3. Where gypsum or Plaster of Paris are used as mould materials, the moulds are coated with a thin layer of a sugar compound such as sucrose or glucose by spraying the mould with a 1% by weight sugar solution with EGTA (ethylene glycol tetraacetic acid), BAPTA (1,2-bis(o-aminophenoxy)ethane-N,N,N',N'-tetraacetic acid), or EDTA (ethylenediaminetetraacetic acid). EGTA, BAPTA and EDTA are chelating agents that help to prevent calcium ions from eluting from the mould walls and contaminating the ITO target surface. The filled moulds are left at ambient temperatures (S10). The material of the slurry compacts into a dense shape 'green body' via the water absorbing action of the porous mould.

The 'green body' is then dried in an oven at 80° C. for 3-5 days (S11) and then fired in a furnace at temperatures of 1000° C.-1750° C. under high purity oxygen (S12). The shape and size of the target is not limited and can be altered simply by altering the shape and size of the mould and moulds of size >100 cm$^2$ can be used. Further targets of the desired dimension and size can be obtained without suffering any crack and bending.

According to the processes of the present invention, ITO targets can be prepared with relative density ≥99%.

EXAMPLES OF EMBODIMENTS

Example 1

Indium(III) and tin(IV) oxides were co-precipitated from solutions of their chloride compounds. Washing of the precipitates was conducted with deionized water such that ~100±k50 ppm of chloride remained in the precipitate. The precipitated hydroxides were then calcined at 800° C. to 1200° C. to yield oxide powders with surface areas in the range 4 to 5 m$^2$/g. A Plaster of Paris mould of dimensions 60 cm×30 cm and cavity thickness of 15 cm was sprayed lightly with a 1% solution of sucrose or a 0.05 molar aqueous solution of EGTA such that no more than 100 cm$^3$ of the sucrose/EGTA solution was used. A slurry containing 14040 g of indium(III) oxide powder 99.99% pure of surface area 5 m$^2$/g, 1560 g of tin(IV) oxide powder 99.99% pure of surface area 4.5 m$^2$/g, 248 g of 22% by weight solution of polycarboxylic acid dispersing agent such as Daravan C, 283 g of acrylic emulsion binder of 55% by weight concentration such as Durmax 1007 from Rhom and Hass, 1.2 g of phosphoric acid and 4800 g of deionized water were placed in a nylon pot of 20000 liter capacity and the whole mixture was thoroughly mixed for 16 hours with a rotating ball mill using yttria stabilized zirconia beads of 12 mm diameter to obtain a slip of intimately blended ITO powder with surface area 8.4 m$^2$/g for slip casting the ITO tiles.

The slip obtained was thoroughly de-aired using ultrasonic agitation and then injected into the porous plaster of Paris mould under pressures of 30 psi. The pressure was maintained for 10 hours. After this period, the pressure was removed and the mould was opened. The ITO green body was taken out, dried at 25° C. for several days and then at 100° C. for several days. The ITO green body compact was then fired in an oxygen atmosphere at 1600° C. for 10 hours. The fired highly dense ITO target was precision cut, surface machined, cleaned in high purity isopropyl alcohol and air dried to give a commercial working target ready for bonding to a copper backing plate and use in a sputtering process. All above operations were performed in a Class 10000 clean room.

The target obtained had relative density of 99.5% and a surface calcium content of less than 0.002%

Example 2

Using the same method as in Example 1 except that 10 g of tin(IV) phosphate was added to the slurry. The target obtained had relative density of 99.2% and a surface calcium content of less than 0.002%

Example 3

Using the same method as in Example 1 except that 10 g of indium(IV) phosphate was added to the slurry. The target obtained had a density of 99.4% and a surface calcium content of less than 0.001%

As explained above, the efficiency of utilization of an ITO target during the process of sputtering can be improved according to the invention of this patent application. Further, the invention provides a process by which a large ITO target of an arbitrary shape can be prepared without the use of hazardous materials such as hydrogen chloride or chlorine gases which are both highly toxic to biological organisms.

Furthermore, ITO targets of relative densities greater than 99% can be prepared with excellent uniformity of density, stoichiometry, and electrical and thermal conductivities across the target body even with target sizes greater than 100 cm$^2$.

It will be appreciated that various modifications can be made to the described embodiments without departing from the spirit and scope of the present invention. In conclusion, the invention provides novel systems, devices, methods and arrangements for ITO sputtering. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method of forming an ITO slip for use in the manufacture of ITO sputtering targets, comprising:
   forming a slip of granulated ITO powder and water;
   wherein the slip includes a phosphorus compound in a concentration between 0.001% and 1% by weight.

2. The method of claim 1, wherein the phosphorus compound is one or more of phosphoric acid, a phosphorous oxide, indium (III) phosphate and tin (IV) phosphate.

3. The method of claim 2, wherein the phosphorus compound includes phosphoric acid.

4. The method of claim 2, wherein the granulated ITO powder in the slip comprises indium(III) and tin(IV) oxides of surface area 4.5-10 m$^2$/g in concentrations of not less than 75% by weight.

5. The method of claim 3, wherein the granulated ITO powder in the slip comprises indium(III) and tin(IV) oxides of surface area 4.5-10 m$^2$/g in concentrations of not less than 75% by weight.

6. The method of claim 1, wherein the granulated ITO powder in the slip comprises indium(III) and tin(IV) oxides of surface area 4.5-10 m$^2$/g in concentrations of not less than 75% by weight.

7. The method of claim 1, wherein the slip also contains a binder and/or a dispersing agent.

* * * * *

UNITED STATES PATENT AND TRADEMARK OFFICE
CERTIFICATE OF CORRECTION

| | |
|---|---|
| PATENT NO. | : 8,778,234 B2 |
| APPLICATION NO. | : 12/992067 |
| DATED | : July 15, 2014 |
| INVENTOR(S) | : Charles Edmund King and Dosten Baluch |

Page 1 of 1

It is certified that error appears in the above-identified patent and that said Letters Patent is hereby corrected as shown below:

In the Claims

1. In column 8, line 46, Claim 4 refers to claim 2, but should refer to claim 1;
2. In column 8, line 50, Claim 5 refers to claim 3, but should refer to claim 1;
3. In column 8, line 54, Claim 6 refers to claim 1, but should refer to claim 2; and
4. In column 8, line 58, Claim 7 refers to claim 1, but should refer to claim 3.

Signed and Sealed this
Thirteenth Day of January, 2015

Michelle K. Lee
*Deputy Director of the United States Patent and Trademark Office*